(12) United States Patent
Yamamoto et al.

(10) Patent No.: US 7,339,249 B2
(45) Date of Patent: Mar. 4, 2008

(54) SEMICONDUCTOR DEVICE

(75) Inventors: Ryota Yamamoto, Kanagawa (JP); Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/066,534

(22) Filed: Feb. 28, 2005

(65) Prior Publication Data

US 2005/0189602 A1    Sep. 1, 2005

(30) Foreign Application Priority Data

Feb. 27, 2004  (JP) .............................. 2004-054408

(51) Int. Cl.
    *H01L 29/00* (2006.01)
(52) U.S. Cl. .................. 257/504; 257/E21.04; 438/140
(58) Field of Classification Search ................ 257/205, 257/504, 494, 495, E21.04; 438/197, FOR. 424, 438/140, FOR. 230
See application file for complete search history.

(56) References Cited

U.S. PATENT DOCUMENTS

| 4,984,043 A | * | 1/1991 | Vinal | .......................... 257/365 |
| 5,374,836 A | * | 12/1994 | Vinal et al. | .................. 257/344 |
| 5,952,701 A | * | 9/1999 | Bulucea et al. | ............. 257/407 |
| 5,973,382 A | * | 10/1999 | Burgener et al. | ........... 257/532 |
| 6,875,650 B2 | * | 4/2005 | Salling et al. | ............... 438/224 |
| 7,180,158 B2 | * | 2/2007 | Khemka et al. | ............ 257/565 |
| 7,253,480 B2 | * | 8/2007 | Chen et al. | .................. 257/355 |
| 2001/0028096 A1 | * | 10/2001 | Ohguro et al. | .............. 257/501 |

FOREIGN PATENT DOCUMENTS

| JP | 2000-049286 A | 2/2000 |
| JP | 2002-016227 A | 1/2002 |

* cited by examiner

*Primary Examiner*—Lex Malsawma
*Assistant Examiner*—Khiem D Nguyen
(74) *Attorney, Agent, or Firm*—Sughrue Mion, Pllc.

(57) ABSTRACT

An insulating film is provided in a region surrounding a circuit region on a p type silicon substrate, and a frame-shaped electrode is provided to surround the circuit region on the insulating film. The region directly under the electrode at the surface of the p type silicon substrate is formed as a non-doped region with no impurity implanted. Then, a positive power supply potential is applied to the electrode. In this way, a depletion layer is formed directly under the electrode at the surface of the p type silicon substrate. Consequently, the substrate noise is shielded.

21 Claims, 5 Drawing Sheets

SEMICONDUCTOR DEVICE

BACKGROUND OF THE INVENTION

1. Field of the Invention

The present invention relates to a semiconductor device including a guard ring.

2. Description of the Related Art

There has been a known technique of providing a guard ring around a circuit region formed at the surface of a semiconductor substrate. FIG. 1 is a sectional view of such a conventional semiconductor device including a guard ring. As shown in FIG. 1, in the semiconductor device, circuit regions 102 and 103 are formed at the surface of a p type silicon substrate 101. The circuit region 102 has a circuit as a noise source such as a digital circuit. The circuit region 103 has a circuit liable to be affected by noise such as an analog circuit. The circuit region 102 is provided with a $p^+$ diffusion region 102a, while the circuit region 103 is provided with a $p^+$ diffusion region 103a. Note that in FIG. 1, the elements other than the $p^+$ diffusion regions 102a and 103a in the circuit regions 102 and 103 are not shown.

A $p^+$ diffusion region 104 is formed to surround the circuit region 103. The $p^+$ diffusion region 104 is connected to a ground potential line and provided with a ground potential. In the region except for the $p^+$ diffusion regions 102a, 103a, and 104 at the surface of the p type silicon substrate 101, an STI (Shallow Trench Isolation) region 105 is formed, and a p well 106 is provided under the STI region 105.

In such a conventional semiconductor device, the circuit in the circuit region 102 operates to create electrical noise, which becomes substrate noise 107 and propagates through the p type silicon substrate 101 and the p well 106. At the time, if the $p^+$ diffusion region 104 is not provided, the substrate noise 107 comes into the circuit region 103 and adversely affects the operation of the circuit in the circuit region 103. However, the $p^+$ diffusion region 104 is formed between the circuit regions 102 and 103, and the $p^+$ diffusion region 104 is provided with the ground potential, so that the substrate noise 107 is partly absorbed into the ground potential line through the $p^+$ diffusion region 104. In this way, the adverse effect upon the operation of the circuit in the circuit region 103 can be prevented to some extent.

Furthermore, according to the technique disclosed by Japanese Patent Laid-Open Publication No. 2000-49286, a guard ring made of an n type diffusion layer is formed at the surface of a semiconductor substrate and a p type diffusion layer is provided in the n-diffusion layer, the n type diffusion layer is connected to a positive power supply terminal, and the p type diffusion layer is connected to a negative power supply terminal. According to the disclosure of Japanese Patent Laid-Open Publication No. 2000-49286, this allows the n type diffusion layer and the p type diffusion layer to be reversely biased to form a bypass capacitor, and the effect of the power supply noise upon the operation of the circuit can be prevented.

The disclosed technique as shown in FIG. 1 however still suffers from the following disadvantage. The ground potential line connected to the $p^+$ diffusion region 104 forming the guard ring and the ground potential line (not shown) connected to the circuit region 103 having the affected circuit are provided as a common line, the substrate noise output from the circuit region 102 and absorbed to the ground potential line through the $p^+$ diffusion region 104 changes the ground potential applied to a circuit in the circuit region 103 and adversely affects the operation of the circuit.

When the ground potential line connected to the $p^+$ diffusion region 104 and the ground potential line (not shown) connected to the circuit region 102 having the noise source circuit are provided as a common line, the noise output from the circuit region 102 is transmitted to the $p^+$ diffusion region 104 through the ground potential line and then comes into the circuit region 103 as substrate noise from the $p^+$ diffusion region 104. In this way, by the above-described conventional technique, the substrate noise is not sufficiently shielded. In the disclosure of Japanese Patent Laid-Open Publication No. 2000-49286, the guard ring is connected to the power supply terminal, and therefore the same disadvantage is encountered.

Meanwhile, in the disclosure of Japanese Patent Laid-Open Publication No. 2002-16227, the guard ring is connected to an external power supply through a bonding pad and a reference potential is applied to the guard ring from the external power supply. According to the technique, the potential of the guard ring can be set independently of the affected circuit and the noise source circuit, and therefore the above-described disadvantage is not encountered.

The above-described technique however suffers from the following different disadvantage. In the semiconductor device as disclosed by Japanese Patent Laid-Open Publication No. 2002-16227, a dedicated bonding pad and a dedicated bonding wire must be provided in order to connect the guard ring to the external power supply, which increases the manufacturing cost for the semiconductor device. Note that the guard ring could be connected to an external power supply through a pin, but then the number of pins necessary for the semiconductor device increases, which also increases the cost. If the ground potential line connected to the guard ring is provided independently of the ground potential line connected to the circuits surrounding the guard ring, the manner of running the line in the semiconductor device would be complicated, which restricts the layout design. Furthermore, according to the technique of applying the ground potential to the guard ring, parasitic impedance is generated between the guard ring and the ground potential line, and the effect of absorbing the substrate noise is reduced. In the disclosure of Japanese Patent Laid-Open Publication No. 2002-16227, the guard ring is connected to the external power supply through the bonding pad and the bonding wire, and therefore impedance additionally provided to the guard ring is extremely large.

SUMMARY OF THE INVENTION

It is an object of the present invention to provide a semiconductor device including a guard ring that can effectively shield substrate noise without having to provide a dedicated reference potential line.

A semiconductor device according to the invention includes a semiconductor substrate, a plurality of circuit regions formed at a surface of the semiconductor substrate, an insulating film provided in a region between the plurality of circuit regions on the semiconductor substrate, and an electrode provided on the insulating film. The electrode is provided with a potential that causes a depletion layer to be formed in a region directly under the electrode at the surface of the semiconductor substrate, so that a current is prevented from passing between the circuit regions.

According to the invention, the potential is applied to the electrode to form the depletion layer in a region directly under the electrode, so that the region between the circuit regions at the surface of the semiconductor substrate can be insulated and substrate noise can be prevented from being transmitted between the circuit regions. The electrode is insulated from the semiconductor substrate by the depletion layer and the insulating film, so that the substrate noise does not come into the electrode, and the noise applied to the electrode does not come into the semiconductor substrate. Therefore, a dedicated line as a reference potential line for applying the potential to the electrode is not necessary.

The region directly under the electrode at the surface of the semiconductor substrate is preferably a non-doped region with no impurity implanted. In this way, the depletion layer can easily be formed in a deeper level.

Preferably, a field effect transistor may be formed in the circuit region, the insulating film may be formed simultaneously with the gate insulating film for the field effect transistor, and the electrode may be formed simultaneously with the gate electrode of the field effect transistor. In this way, the insulating film and the electrode can be formed simultaneously with the field effect transistor without special steps, and therefore the manufacturing cost for the semiconductor device is not increased.

The electrode is preferably formed to surround one such circuit region. In this way, substrate noise can surely be prevented from coming into the circuit region.

According to the invention, an electrode is provided in a region between circuit regions on a semiconductor substrate, and a depletion layer is provided in a region between the circuit regions at the surface of the semiconductor substrate, so that substrate noise can be prevented from being transmitted between the circuit regions. The electrode is insulated from the semiconductor substrate, and therefore the substrate noise does not come into the electrode, and the power supply noise does not come into the semiconductor substrate without a reference potential line dedicated to the electrode, so that the substrate noise can sufficiently be shielded.

DETAILED DESCRIPTION OF THE PREFERRED EMBODIMENTS

Figure 1:
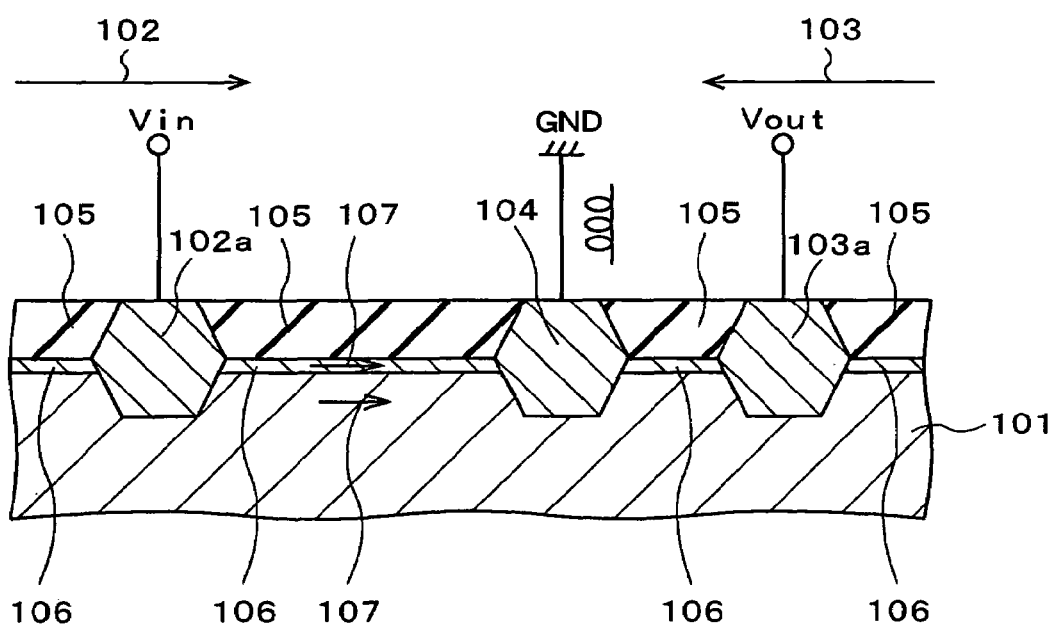
FIG. 1 is a sectional view of a conventional semiconductor device.
Figure 2:
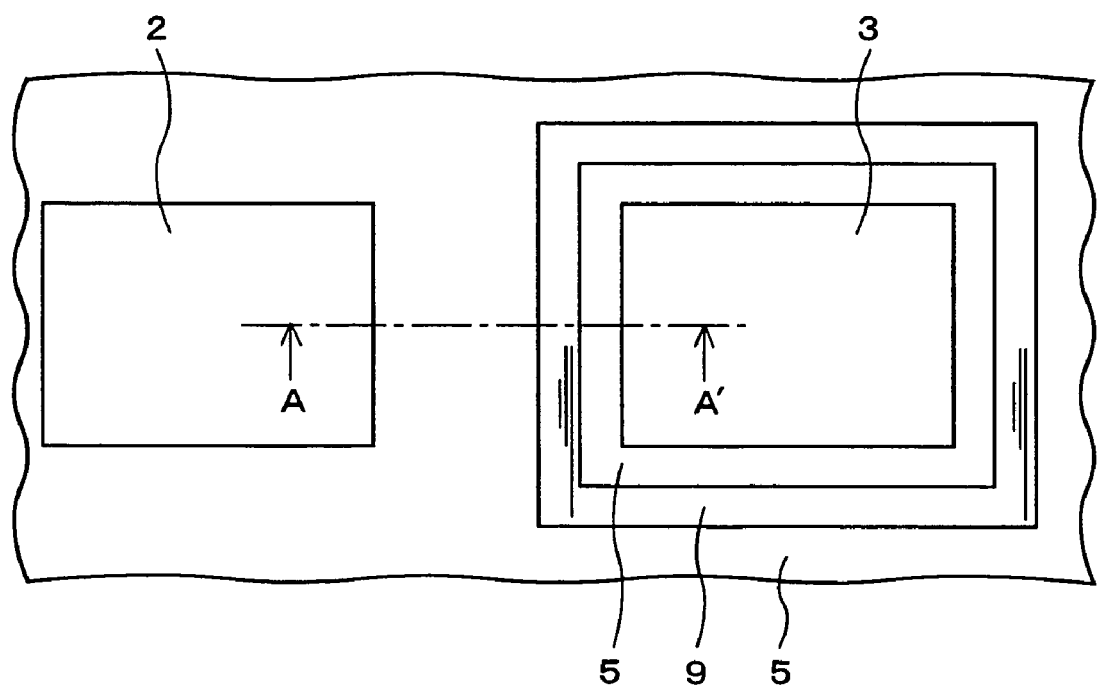
FIG. 2 is a plan view of a semiconductor device according to a first embodiment of the invention.
Figure 3:
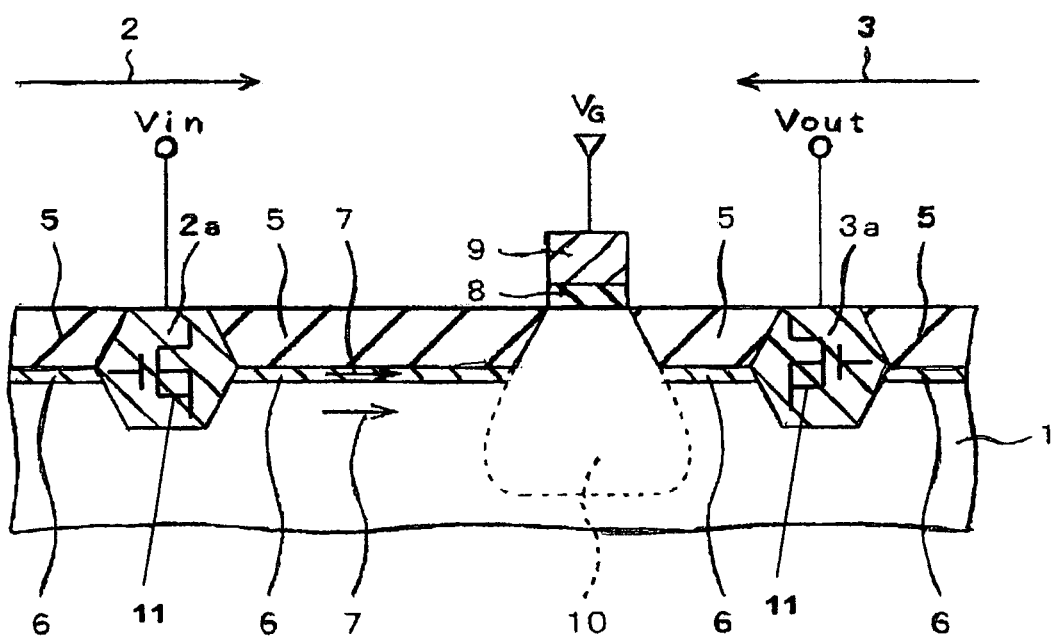
FIG. 3 is a sectional view taken along the line A-A' in FIG. 2.

Now, embodiments of the invention will be described in detail in conjunction with the accompanying drawings. A first embodiment of the invention will be described. FIG. 2 is a plan view of a semiconductor device according to the embodiment, and FIG. 3 is a sectional view taken along the line A-A' in FIG. 2. As shown in FIGS. 2 and 3, in the semiconductor device according to the embodiment, a p type silicon substrate 1 is provided, and there are circuit regions 2 and 3 formed at the surface of the p type silicon substrate 1. The circuit region 2 has a circuit as a noise source such as a digital circuit. The circuit region 3 has an affected circuit liable to be affected by noise such as an analog circuit and for example a PLL circuit (Phase-Locked Loop circuit) is provided in the region.

The circuit region 2 has a p$^+$ diffusion region 2a, and the circuit region 3 has a p$^+$ diffusion region 3a. The p$^+$ diffusion regions 2a and 3a are connected to upper layer lines (not shown) through contacts (not shown). Note that in FIG. 3, the elements other than the p$^+$ diffusion regions 2a and 3a in the circuit regions 2 and 3 are not shown. In FIGS. 2 and 3, only the circuit regions 2 and 3 are shown, while a circuit region other than the circuit regions 2 and 3 may be provided in the semiconductor device according to the embodiment.

An insulating film 8 is provided to surround the circuit region 3 on the p type silicon substrate 1 when viewed in the direction perpendicular to the surface of the p type silicon substrate 1. A rectangular frame-shaped electrode 9 to surround the circuit region 3 is provided on the insulating film 8. Note that in FIGS. 2 and 3, the insulating film 8 is provided only directly under the electrode 9, but the insulating film 8 may be provided in another region as long as the film is provided at least directly under the electrode 9. In this way, the insulating film 8 and the electrode 9 are provided at least in the region between the circuit region 2 having the noise source circuit and the circuit region 3 having the affected circuit.

An MOSFET (Metal Oxide Semiconductor Field Effect Transistor which is not shown) is provided in each of the circuit regions 2 and 3, and the insulating film 8 is simultaneously formed with the gate insulating film for the MOSFETs and for example made of silicon oxide. The electrode 9 is formed simultaneously with the gate electrode of the MOSFET and for example made of polysilicon.

The electrode 9 is connected to a DC power supply (not shown) through a power supply potential line (not shown) and provided with a positive power supply potential $V_G$. The power supply potential line connected to the electrode 9 and the power supply potential line connected to the circuit region 2 or 3 may be provided as a common line. An STI (Shallow Trench Isolation) region 5 is provided in part of the region at the surface of the p type silicon substrate 1 excluding the diffusion regions including the p$^+$ diffusion regions 2a and 3a and the region directly under the electrode 9. A p well 6 is formed under the STI region 5. The region directly under the electrode 9 at the surface of the p type silicon substrate 1 is a non-doped region with no impurity implanted. More specifically, the p well 6 is not provided directly under the electrode 9.

The operation of the semiconductor device according to the embodiment as described above will be described. As shown in FIGS. 2 and 3, the electrode 9 is provided with a power supply potential $V_G$ through the power supply potential line (not shown). In this way, in the region directly under the electrode 9 at the surface of the p type silicon substrate 1, the hole density is reduced and a depletion layer 10 is formed. When the depletion layer 10 is not formed, the resistivity of the region directly under the electrode 9 in the p type silicon substrate 1 is equal to the original resistivity of the p type silicon substrate 1, which is for example 10 Ω·cm. When the depletion layer 10 is formed, the resistivity of the directly under region is about 10 to 100 times the original resistivity of the p type silicon substrate 1, and the depletion layer 10 is almost insulated. In this way, a capacitance is formed between the circuit regions 2 and 3 by the depletion layer 10. Note that when the resistivity of the p type silicon substrate 1 is 10 Ω·cm, the depth of the depletion layer 10 is about 1 μm.

In this state, when the noise source circuit in the circuit region 2 operates and causes electric noise, the noise becomes substrate noise 7 and propagates through the p type silicon substrate 1 and the p well 6. At the time, the substrate noise 7 partly propagates toward the circuit region 3 having the affected circuit. However, the depletion layer 10 around the circuit region 3 shields and prevents the substrate noise 7 from coming into the circuit region 3. The substrate noise 7 propagating at the surface of the p type silicon substrate 1 such as the p well 6 and the surrounding area in particular is effectively shielded. At the time, the capacitance is formed by the depletion layer 10 between the circuit regions 2 and 3, so that a low frequency component in the substrate noise 7 is particularly effectively shielded. When the width of the electrode 9 is increased and the width of the depletion layer 10 is increased, the value of the capacitance formed by the depletion layer 10 is reduced, so that a high frequency component in the substrate noise 7 can also be shielded.

The electrode 9 is insulated from the p type silicon substrate 1 by the depletion layer 10 and the insulating layer 8, and therefore the substrate noise 7 transmitted through the p type silicon substrate 1 and the p well 6 does not come into the electrode 9. Therefore, if the power supply potential line connected to the electrode 9 and the power supply potential line connected to the affected circuit in the circuit region 3 are provided as a common line, the substrate noise 7 does not change the power supply potential of the affected circuit through the common power supply potential line. If the power supply potential line connected to the electrode 9 and the power supply potential line connected to the noise source circuit in the circuit region 2 are provided as a common line, the power supply noise transmitted to the electrode 9 from the circuit region 2 through the common power supply line only slightly changes the depth of the depletion layer 10 and is unlikely to come into the p type silicon substrate 1. Therefore, the noise output from the circuit region 2 is not transmitted to the p type silicon substrate 1 through the power supply potential line and the electrode 9 and does not come into the circuit region 3.

Note that if the depletion layer 10 is not provided in the p type semiconductor substrate unlike the embodiment, the substrate noise may be shielded by an insulating film filled in the region between the circuit regions 2 and 3. In this case, however, the process of forming an insulating film having a depth greater than the STI region 5 specifically for the purpose is necessary, which pushes up the manufacturing cost for the semiconductor device.

In this way, according to the embodiment, the depletion layer 10 is formed in the region around the circuit region 3 at the surface of the p type silicon substrate 1, and therefore the substrate noise 7 output from the noise source circuit in the circuit region 2 is shielded by the depletion layer 10 and prevented from coming into the affected circuit in the circuit region 3. The substrate noise propagating at the surface of the p type silicon substrate 1 in particular can be effectively shielded.

The region directly under the electrode 9 at the surface of the p type silicon substrate 1 is a non-doped region with no p well formed, and therefore the depletion layer 10 can have a large depth. In this way, the effect of shielding the substrate noise 7 is even more improved.

In addition, the p type silicon substrate 1 and the electrode 9 are insulated from each other by the depletion layer 10 and the insulating film 8, so that the power supply potential line connected to the electrode 9 and the power supply potential line connected to the noise source circuit or the affected circuit may be provided as a common line. In other words, a power supply potential line specifically for the electrode 9 is not necessary. This makes the layout design of the semiconductor device less restricted.

Furthermore, the insulating film 8 can be formed simultaneously with the gate insulating film for the MOSFET formed in the circuit regions 2 and 3, and the electrode 9 can be formed simultaneously with the gate electrode of the MOSFET, so that typical process can be employed for the manufacture without having to carry out special steps for forming the insulating film 8 and the electrode 9. Therefore, the manufacturing cost for the semiconductor device is not increased.

Figure 4:
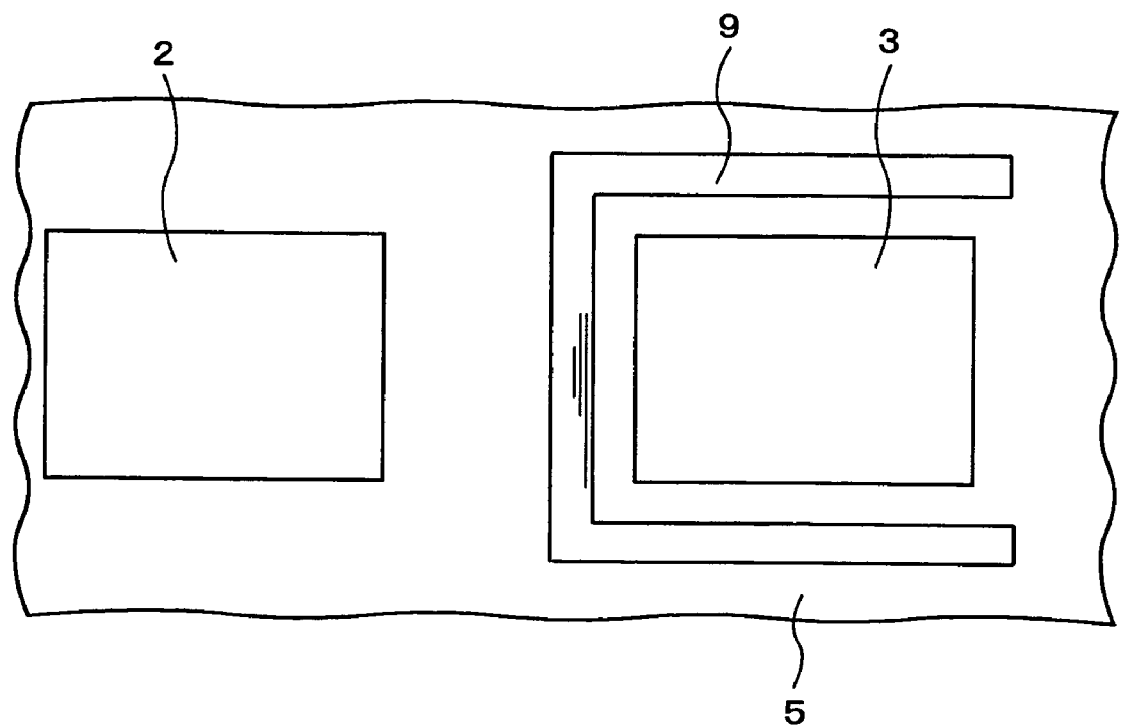
FIG. 4 is a plan view of a semiconductor device according to a second embodiment of the invention.
Figure 5:
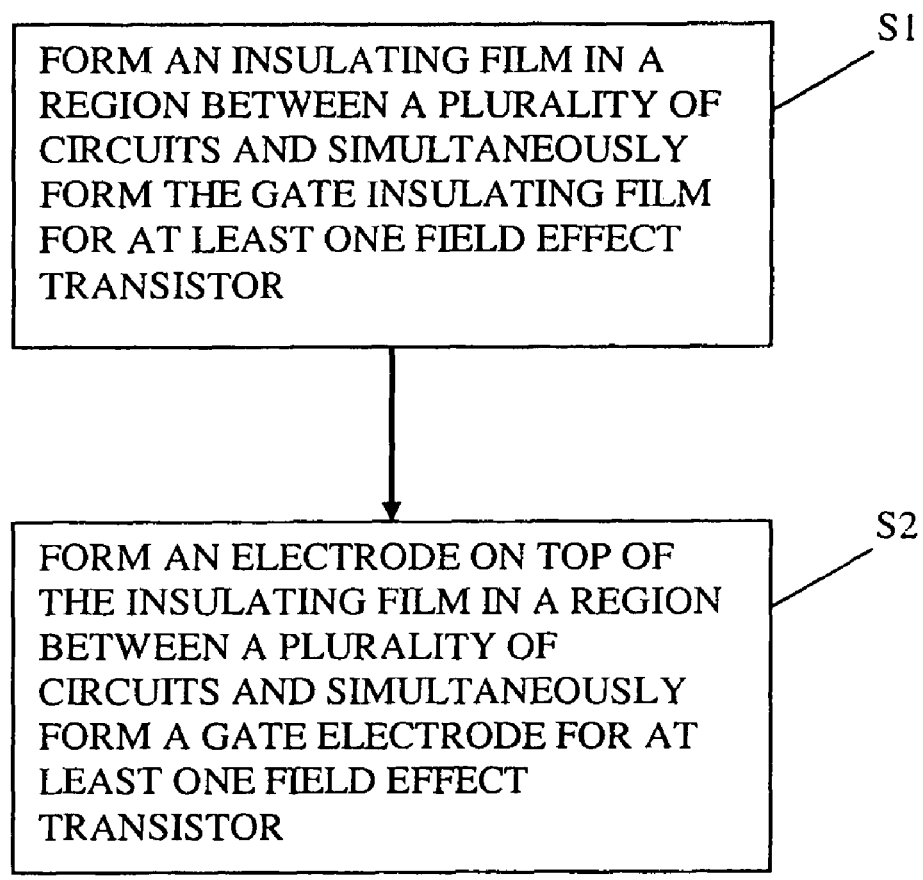
FIG. 5 is a diagram of a process for forming insulating films and electrodes according to an exemplary embodiment of the invention.

Now, a second embodiment of the invention will be described. FIG. 4 is a plan view of a semiconductor device according to the present embodiment. As shown in FIG. 2, in the first embodiment described above, the electrode 9 is provided in a frame shape surrounding the circuit region 3 when viewed in the direction perpendicular to the surface of the p type silicon substrate 1. Meanwhile, as shown in FIG. 4, according to the second embodiment, when viewed in the direction perpendicular to the surface of the p type silicon substrate 1, the electrode 9 is formed in a U-shape, and its side opposite to the circuit region 2 is open when viewed from the side of the circuit region 3. The other structure, operation, and effects according to the second embodiment are the same as those according to the first embodiment described above.

Note that in the above-described embodiments, the electrode 9 is provided with a positive power supply potential, while any potential may be applied to the electrode 9 as long as the potential causes a depletion layer to be formed in the region directly under the electrode 9. When for example an n type substrate is used as the semiconductor substrate, a negative potential can be applied.

In the above described embodiments, the electrode 9 is formed to surround the circuit region 3 having the affected circuit, but the electrode 9 may be formed to surround the circuit region 2 having the noise source circuit. In the embodiments described above, the electrode 9 is formed in a frame or U-shape when viewed in the direction perpendicular to the surface of the p type silicon substrate 1, but the invention is not limited those manners, the electrode 9 may be formed for example in a strip-shape lying between the circuit regions 2 and 3 according to the invention.

Furthermore, an SOI (Silicon On Insulator) substrate may be used instead of the p type silicon substrate 1. In this case, the depletion layer may be formed to reach the insulating film in the SOI substrate, so that the substrate noise can be particularly effectively shielded.

What is claimed is:

1. A semiconductor device comprising:
 a semiconductor substrate;
 a plurality of circuits at different regions at a surface of said semiconductor substrate;
 an insulating film provided in a region between said plurality of circuits on said semiconductor substrate; and
 an electrode provided on said insulating film, wherein said electrode is provided with a potential that causes a depletion layer to be formed in a region directly under said electrode at the surface of said semiconductor substrate, so that a current is prevented from passing between said plurality of circuits.

2. The semiconductor device according to claim 1, wherein said region directly under said electrode at the surface of said semiconductor substrate is a non-doped region with no impurity implanted.

3. The semiconductor device according to claim 1, wherein said semiconductor substrate is a p type semiconductor substrate and said potential is a positive power supply potential.

4. The semiconductor device according to claim 1, wherein said semiconductor substrate is an n type semiconductor substrate and said potential is a negative power supply potential.

5. The semiconductor device according to claim 1, wherein at least one of said plurality of circuits comprises at least one field effect transistor, said at least one field effect transistor comprising:
 a gate comprising said insulating film; and
 a gate electrode provided on said insulating film, wherein said gate electrode and said electrode comprise a conductive material.

6. The semiconductor device according to claim 1, wherein said electrode and said insulating film are formed to surround one of said plurality of circuits.

7. The semiconductor device according to claim 1, wherein said insulating film comprises silicon oxide.

8. The semiconductor device according to claim 1, wherein said electrode comprises polysilicon.

9. The semiconductor device according to claim 5, wherein said insulating film comprises silicon oxide.

10. The semiconductor device according to claim 5, wherein said conductive material is polysilicon.

11. The semiconductor device according to claim 1 wherein said insulating film is provided between said plurality of circuits and said electrode.

12. The semiconductor device according to claim 11, wherein said plurality of circuits comprises at least one of digital circuits and analog circuits.

13. The semiconductor device according to claim 1, further comprising:
 a shallow trench isolation region provided at a surface of said semiconductor substrate between said electrode and said plurality of circuits,
 wherein said electrode is disposed adjacent to said shallow trench isolation region.

14. A semiconductor device comprising:
 a semiconductor substrate;
 a plurality of circuits at different regions at a surface of said semiconductor substrate;
 an insulating film provided in a region between said plurality of circuits on said semiconductor substrate, said insulating film surrounding at least one of said plurality of circuits; and
 an electrode comprising a conductive material provided on said insulating film, wherein said electrode is provided with a potential that causes a depletion layer to be formed in a region directly under said electrode at the surface of said semiconductor substrate.

15. The semiconductor device according to claim 14, wherein said region directly under said electrode at the surface of said semiconductor substrate is a non-doped region with no impurity implanted.

16. The semiconductor device according to claim 14, wherein said semiconductor substrate is a p type semiconductor substrate and said potential is a positive power supply potential.

17. The semiconductor device according to claim 14, wherein said semiconductor substrate is an n type semiconductor substrate and said potential is a negative power supply potential.

18. The semiconductor device according to claim 14, wherein said insulating film is silicon oxide.

19. The semiconductor device according to claim 14, wherein said conductive material is polysilicon.

20. A semiconductor device comprising:
 a first circuit comprising a plurality of devices disposed on a first portion of a semiconductor substrate;
 a second circuit comprising a plurality of devices disposed on a second portion of the semiconductor substrate; and
 an isolating structure formed between the first portion and the second portion of the semiconductor substrate which prevents current from passing between the first portion and the second portion of the semiconductor substrate, wherein the isolating structure comprises an insulating film, and an electrode provided on the insulating film, and wherein the electrode is provided with a potential causing formation of a depletion layer in a region of the semiconductor substrate under the electrode.

21. The semiconductor device according to claim 20 further comprising:
 a plurality of circuits; and
 a plurality of isolating structures formed their between.

* * * * *